United States Patent
Yang

(10) Patent No.: US 12,342,491 B2
(45) Date of Patent: Jun. 24, 2025

(54) SERVER

(71) Applicants: INVENTEC (PUDONG) TECHNOLOGY CORPORATION, Shanghai (CN); INVENTEC CORPORATION, Taipei (TW)

(72) Inventor: Chi-Chun Yang, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 218 days.

(21) Appl. No.: 18/208,690

(22) Filed: Jun. 12, 2023

(65) Prior Publication Data

US 2024/0306339 A1 Sep. 12, 2024

(30) Foreign Application Priority Data

Mar. 6, 2023 (CN) .......................... 202310208440.5

(51) Int. Cl.
G06F 1/18 (2006.01)
H05K 7/14 (2006.01)

(52) U.S. Cl.
CPC ........... H05K 7/1489 (2013.01); G06F 1/185 (2013.01)

(58) Field of Classification Search
CPC ...................................................... G06F 1/185
USPC .................................................. 361/679.32
See application file for complete search history.

(56) References Cited

U.S. PATENT DOCUMENTS

| | | | | |
|---|---|---|---|---|
| 2,987,693 | A | * | 6/1961 | Wamsley ......... H01R 13/62933 439/157 |
| 3,476,258 | A | * | 11/1969 | Carl ..................... H05K 7/1409 439/157 |
| 3,488,622 | A | * | 1/1970 | Gley .................... H01R 13/629 439/157 |
| 4,260,210 | A | * | 4/1981 | Babuka .................. H01R 12/88 439/347 |
| 4,902,239 | A | * | 2/1990 | Schindler ............. H05K 7/1409 439/153 |
| 5,199,884 | A | * | 4/1993 | Kaufman ............. H01R 12/716 439/570 |
| 5,244,400 | A | * | 9/1993 | Hatagishi ............. H01R 13/641 439/157 |
| 5,320,544 | A | * | 6/1994 | Naoto .............. H01R 13/62938 439/157 |
| 5,338,214 | A | * | 8/1994 | Steffes .................... G06F 1/186 439/928 |
| 5,556,286 | A | * | 9/1996 | Ikesugi .................. H01R 12/73 439/31 |

(Continued)

*Primary Examiner* — Adrian S Wilson
(74) *Attorney, Agent, or Firm* — Maschoff Brennan

(57) ABSTRACT

A server including a motherboard, a first connector, an expansion card, a second connector and an auxiliary assembly. The first connector is disposed on the motherboard. The second connector is disposed on the expansion card and plugged with the first connector. The auxiliary assembly includes a handle and a mounting protrusion. The handle is movably disposed on the motherboard, and the mounting protrusion is disposed on the expansion card. When the handle pushes the mounting protrusion, the handle facilitates the second connector and the first connector to be plugged with or detach from each other, so as to facilitate the motherboard to be electrically connected to or electrically disconnected from the expansion card.

8 Claims, 4 Drawing Sheets

(56) References Cited

U.S. PATENT DOCUMENTS

| | | | | |
|---|---|---|---|---|
| 5,888,080 | A * | 3/1999 | Maejima | H01R 13/62905 439/157 |
| 5,967,799 | A * | 10/1999 | Arai | H01R 12/775 439/108 |
| 6,033,254 | A * | 3/2000 | Neal | H01R 12/7005 439/377 |
| 6,095,833 | A * | 8/2000 | Osawa | H01R 13/62933 439/157 |
| 6,361,358 | B1 * | 3/2002 | Kajinuma | H01R 12/79 439/422 |
| 6,409,526 | B1 * | 6/2002 | Malone | H01R 13/621 439/75 |
| 6,705,882 | B2 * | 3/2004 | Casses | H01R 13/62933 439/153 |
| 6,997,725 | B2 * | 2/2006 | Stella | H01R 13/62977 439/372 |
| 7,241,155 | B2 * | 7/2007 | Tyler | H01R 13/62944 439/372 |
| 7,261,600 | B2 * | 8/2007 | Park | H01R 12/737 386/E5.069 |
| 7,329,133 | B2 * | 2/2008 | Ishikawa | H01R 13/62938 439/372 |
| 7,684,179 | B1 * | 3/2010 | Lima | H05K 7/1411 361/732 |
| 7,695,296 | B1 * | 4/2010 | Hitchcock | H01R 13/62922 439/372 |
| 7,695,297 | B2 * | 4/2010 | Pittenger | H01R 13/62977 439/157 |
| 7,744,390 | B2 * | 6/2010 | Tyler | H01R 13/62938 439/372 |
| 8,133,065 | B2 * | 3/2012 | Horiuchi | H01R 13/62938 439/157 |
| 8,246,365 | B2 * | 8/2012 | Shishikura | H01R 13/62944 439/157 |
| 8,472,179 | B1 * | 6/2013 | Lima | H05K 7/1411 361/732 |
| 8,632,349 | B2 * | 1/2014 | Genta | H01R 13/62977 439/157 |
| 8,747,130 | B2 * | 6/2014 | Tyler | H01R 13/62972 439/372 |
| 9,209,540 | B2 * | 12/2015 | Raff | H01R 12/716 |
| 9,225,115 | B2 * | 12/2015 | Malek | H01R 12/79 |
| 10,535,952 | B2 * | 1/2020 | Mamiya | H01R 13/4538 |
| 10,564,685 | B2 * | 2/2020 | Chen | G06F 1/185 |
| 10,971,856 | B1 * | 4/2021 | Reynoso Galvan | H01R 13/62938 |
| 11,439,033 | B2 * | 9/2022 | Mao | H05K 7/1457 |
| 11,522,315 | B2 * | 12/2022 | Moreau | H01R 13/516 |
| 11,696,404 | B2 * | 7/2023 | Kim | H05K 3/365 361/803 |
| 11,997,821 | B2 * | 5/2024 | Wang | H05K 5/023 |
| 12,144,138 | B2 * | 11/2024 | Hung | H05K 7/16 |
| 2002/0182908 | A1 * | 12/2002 | Maegawa | H01R 13/4538 439/157 |
| 2003/0003786 | A1 * | 1/2003 | Bakker | H01R 13/4538 439/157 |
| 2003/0117779 | A1 * | 6/2003 | Gough | H05K 7/1488 361/728 |
| 2004/0192090 | A1 * | 9/2004 | Flowers | H01R 13/639 439/157 |
| 2006/0171110 | A1 * | 8/2006 | Li | G11B 33/128 |
| 2024/0306335 | A1 * | 9/2024 | Yang | G06F 1/185 |

* cited by examiner

SERVER

CROSS-REFERENCE TO RELATED APPLICATIONS

This non-provisional application claims priority under 35 U.S.C. § 119(a) on Patent Application No(s). 202310208440.5 filed in China, on Mar. 6, 2023, the entire contents of which are hereby incorporated by reference.

BACKGROUND OF THE INVENTION

Technical Field of the Invention

The invention relates to a server, more particularly to a server including a motherboard and at least one expansion card.

Description of the Related Art

With the demand for the performance of an expansion card in a server increases, the expansion card should include more electronic components and have more complex structure, which increases the weight of the expansion card. Thus, in order to facilitate the expansion card to be installed on the motherboard, there may be a handle on the expansion card and a mounting protrusion on the motherboard. In this way, the installation of the expansion card and the motherboard can be completed in a labor-saving manner via the cooperation of the handle and the mounting protrusion.

However, the structure of the handle should be complex to facilitate the installation, removal and positioning of the expansion card. Thus, a significant amount of space on the expansion card is occupied by the handle. Accordingly, not only the overall weight of the expansion card is further increased, but also less space on the expansion card is available for other components to be mounted thereon.

SUMMARY OF THE INVENTION

The invention is to provide a server to reduce the space on the expansion card occupied by the auxiliary assembly including the handle and the mounting protrusion.

One embodiment of this invention provides a server including a motherboard, a first connector, an expansion card, a second connector and an auxiliary assembly. The first connector is disposed on the motherboard. The second connector is disposed on the expansion card and plugged with the first connector. The auxiliary assembly includes a handle and a mounting protrusion. The handle is movably disposed on the motherboard, and the mounting protrusion is disposed on the expansion card. When the handle pushes the mounting protrusion, the handle facilitates the second connector and the first connector to be plugged with or detach from each other, so as to facilitate the motherboard to be electrically connected to or electrically disconnected from the expansion card.

According to the server disclosed by above embodiments, the handle is movably disposed on the motherboard, and the mounting protrusion is disposed on the expansion card. That is, comparing to the conventional server where the handle is disposed on the expansion card and the mounting protrusion is disposed on the motherboard, the present invention exchanges the disposed positions of the handle and the mounting protrusion. Accordingly, by moving the handle from the expansion card to the motherboard, the labor-saving efficacy is kept while preventing the handle from occupying significant amount of space on the expansion card. In this way, not only the overall weight of the expansion card is reduced, but also the space on the expansion card available for other components is increased.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

Figure 1:
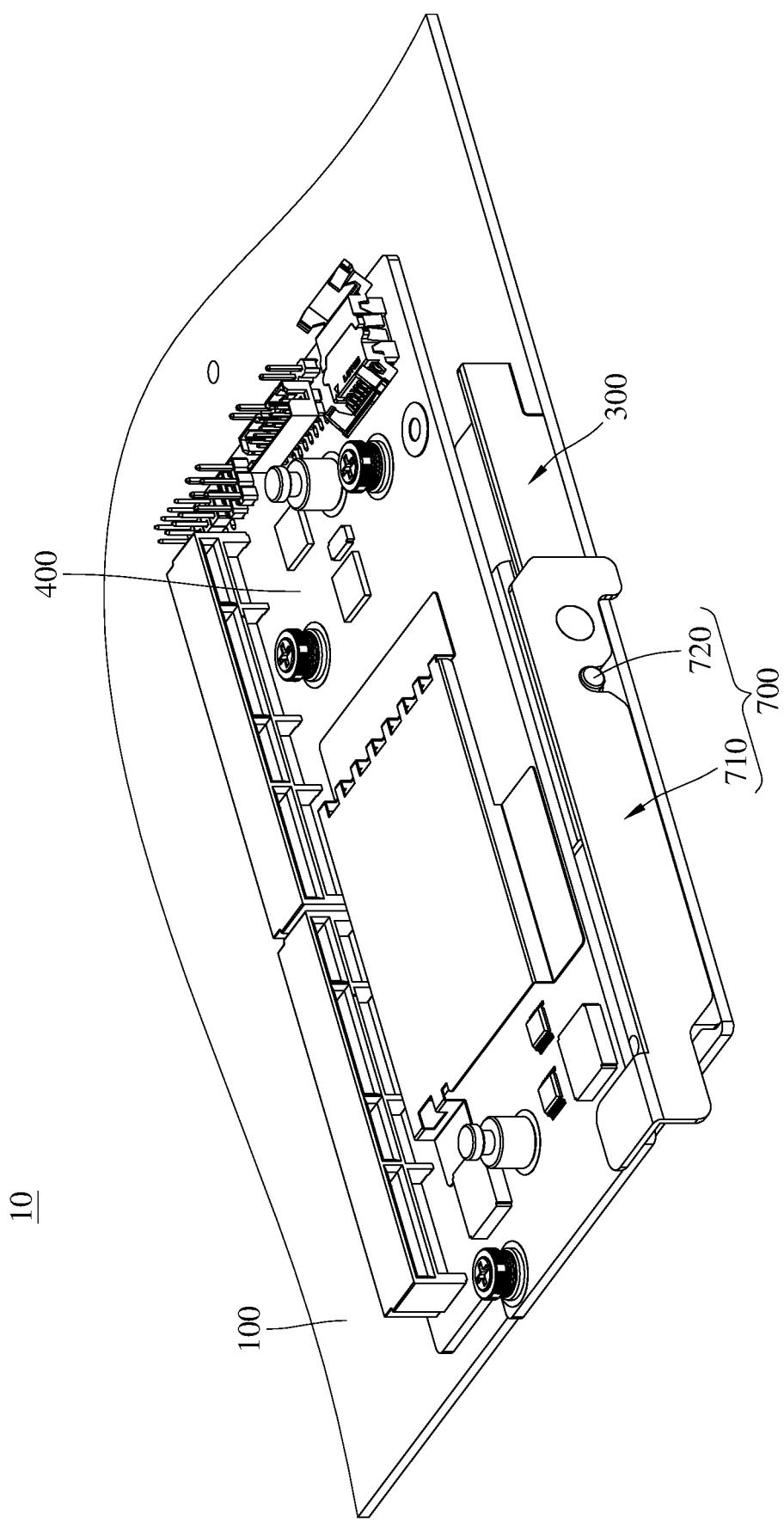
FIG. 1 is a partially enlarged perspective view of a server according to one embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
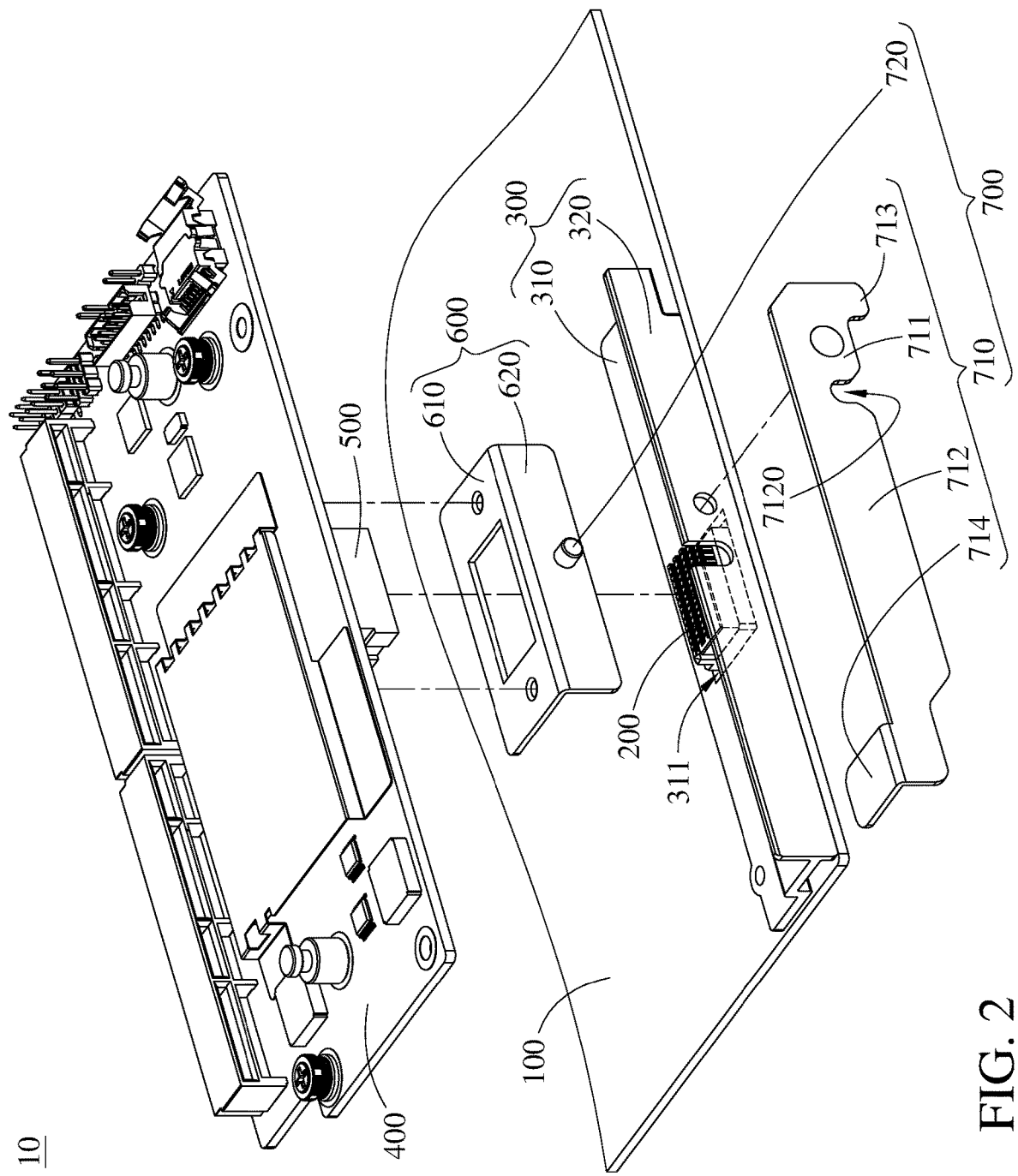
FIG. 2 is a partially enlarged exploded view of the server in FIG. 1.

Please refer to FIGS. 1 and 2. FIG. 1 is a partially enlarged perspective view of a server 10 according to one embodiment of the invention. FIG. 2 is a partially enlarged exploded view of the server 10 in FIG. 1.

In this embodiment, the server 10 includes a motherboard 100, a first connector 200, a first bracket 300, an expansion card 400, a second connector 500, a second bracket 600 and an auxiliary assembly 700. The expansion card 400 may be, for example, a network interface card, or a Graphic Processing Unit (GPU) card, but the invention is not limited thereto.

The first connector 200 is disposed on and electrically connected to the motherboard 100. In this embodiment, the first bracket 300 includes a first fixed plate 310 and a first side plate 320. The first fixed plate 310 is fixed to a side of the motherboard 100 located closest to the expansion card 400. The first side plate 320 stands on a side of the first fixed plate 310 located farthest away from the motherboard 100. In addition, in this embodiment, the first fixed plate 310 includes a first through hole 311. The first connector 200 is disposed through the first through hole 311. That is, in this embodiment, the first fixed plate 310 surrounds the first connector 200. Note that in other embodiments, the first fixed plate may not include the first through hole, and the first fixed plate may not surround the first connector.

The second connector 500 is disposed on the motherboard 100 and electrically connected to the expansion card 400. The second connector 500 and the first connector 200 are plugged with each other, so as to allow the expansion card 400 to be electrically connected to the motherboard 100 via the first connector 200 and the second connector 500.

In this embodiment, the second bracket 600 includes a second fixed plate 610 and a second side plate 620. The second fixed plate 610 is fixed to a side of the expansion card 400 located closest to the motherboard 100. The second side plate 620 stands on a side of the second fixed plate 610 located farthest away from the expansion card 400. In addition, in this embodiment, the second fixed plate 610 includes a second through hole 611. The second connector 500 is disposed through the second through hole 611. That is, in this embodiment, the second fixed plate 610 surrounds the second connector 500. Note that in other embodiments, the second fixed plate may not include the second through hole, and the second fixed plate may not surround the second connector.

The auxiliary assembly 700 includes a handle 710 and a mounting protrusion 720. In this embodiment, the handle 710 includes a pivoted part 711, a connecting part 712, a pushing protrusion 713 and a handheld part 714. The pivoted part 711 is pivotally connected to the first side plate 320 of the first bracket 300. The connecting part 712 and the pushing protrusion 713 are connected to two opposite sides of the pivoted part 711, respectively. The connecting part 712 connects the pivoted part 711 and the handheld part 714. In this embodiment, the connecting part 712 includes a notch 7120. The mounting protrusion 720 protrudes from the second side plate 620 of the second bracket 600.

Note that in other embodiments, the server 10 may not include the first bracket 300, and the handle 710 is directly and pivotally connected to the motherboard 100. In other embodiments, the server 10 may not include the second bracket 600, and the mounting protrusion 720 is directly disposed on the expansion card 400.

Figure 3:
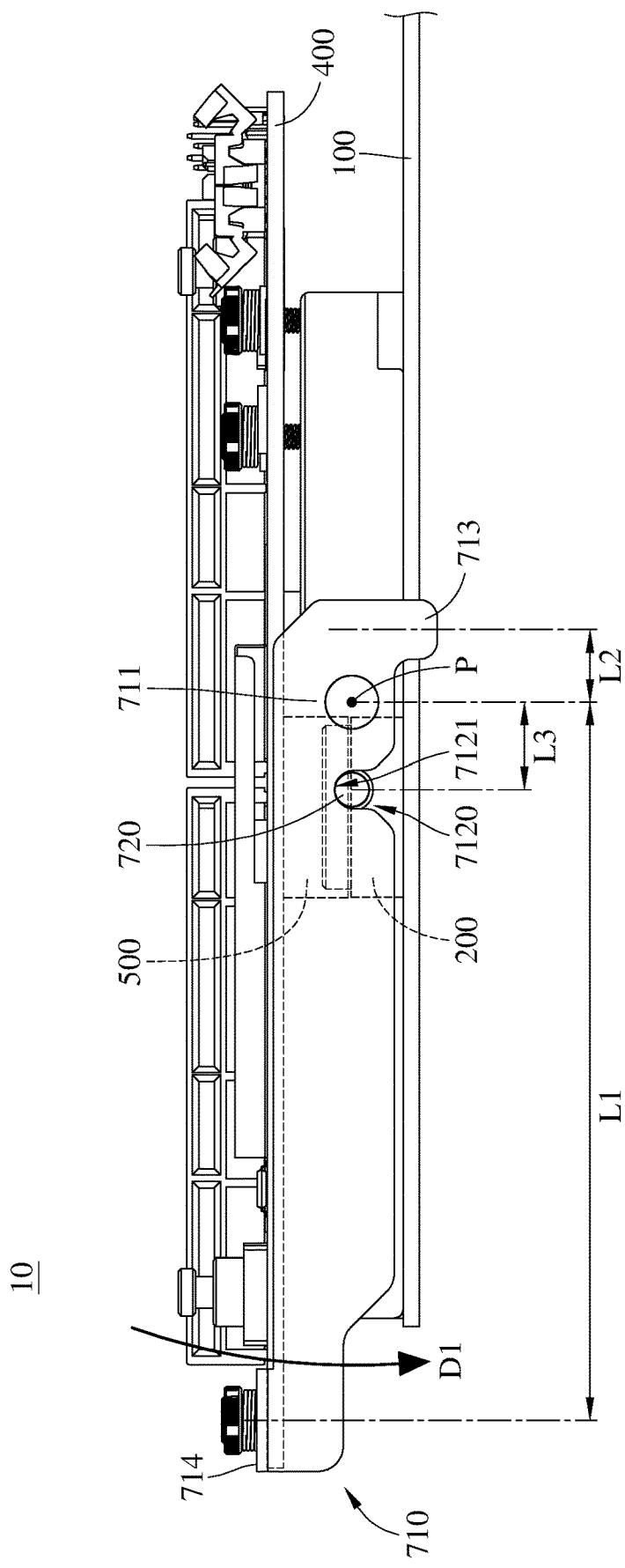
FIG. 3 is a side cross-sectional view showing the installation of an expansion card of the server in FIG. 1.

Please refer to FIG. 3. FIG. 3 is a side cross-sectional view showing the installation of the expansion card 400 of the server 10 in FIG. 1. In this embodiment, a radial protruding length L1 of the handheld part 714 relative to a pivot center P of the pivoted part 711 is longer than a radial protruding length L2 of the pushing protrusion 713 relative to the pivot center P of the pivoted part 711, and longer than a radial protruding length L3 of the notch 7120 relative to the pivot center P of the pivoted part 711. That is, L1>L2 and L1>L3.

As shown in FIG. 3, when the handheld part 714 is held to be rotated along an installing direction D1, the mounting protrusion 720 is located in the notch 7120 and is pushed by a wall surface 7121 of the connecting part 712 forming the notch 7120, thereby facilitating the second connector 500 and the first connector 200 to be plugged with each other via the handle 710. In this way, the motherboard 100 is electrically connected to the expansion card 400. Since the radial protruding length L1 of the handheld part 714 is longer than the radial protruding length L3 of the notch 7120, the labor for plugging the second connector 500 and the first connector 200 is saved by the handle 710.

Figure 4:
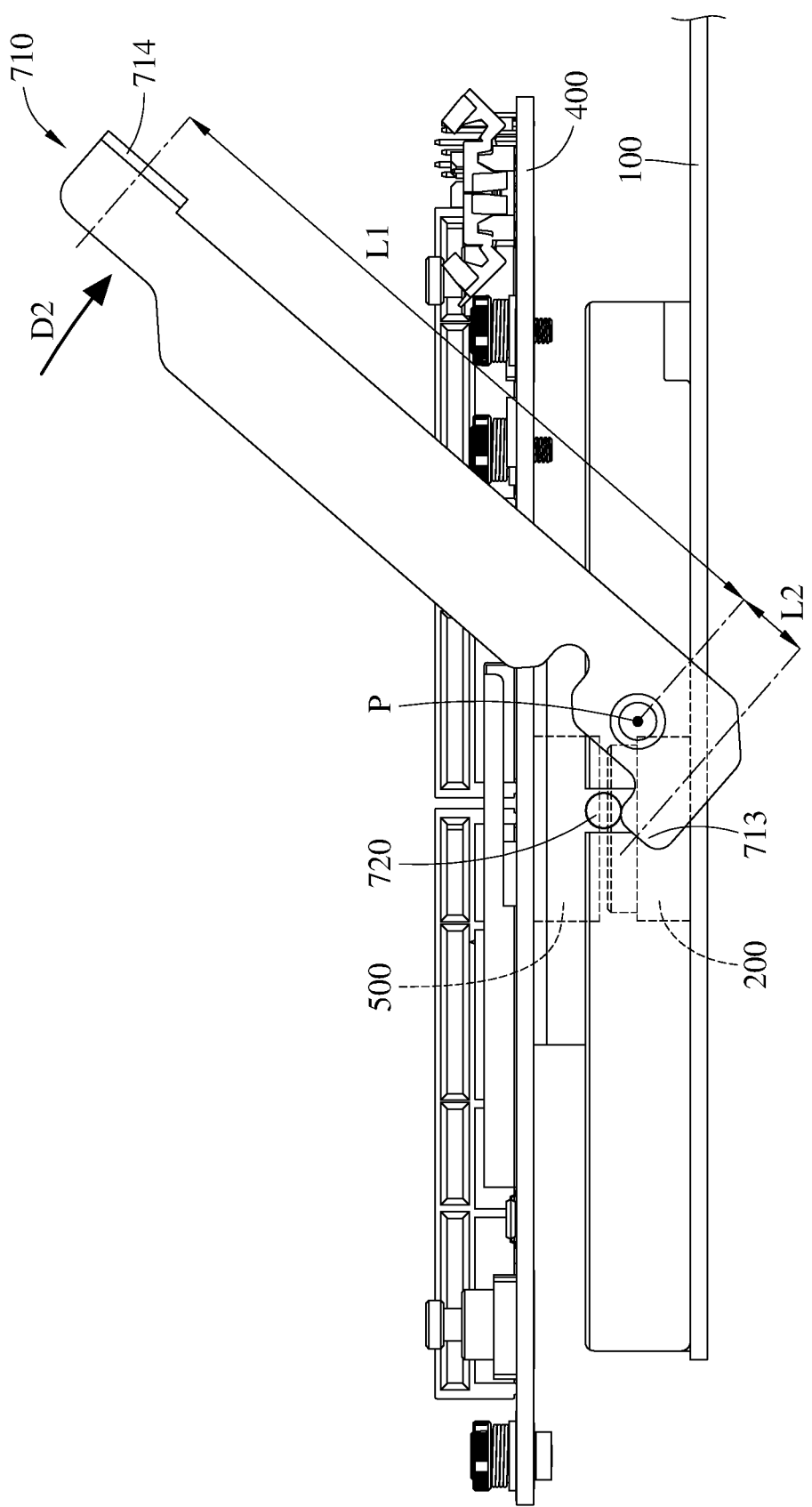
FIG. 4 is a side cross-sectional view showing the removal of the expansion card of the server in FIG. 1.

Please refer to FIG. 4. FIG. 4 is a side cross-sectional view showing the removal of the expansion card 400 of the server 10 in FIG. 1. When the handheld part 714 is held to be rotated along a removing direction D2 opposite to the installing direction D1 in FIG. 3, the pushing protrusion 713 pushes the mounting protrusion 720, so as to force the handle 710 to facilitate the second connector 500 and the first connector 200 to be detached from each other. In this way, the motherboard 100 is electrically disconnected from the expansion card 400. Since the radial protruding length L1 of the handheld part 714 is longer than the radial protruding length L2 of the pushing protrusion 713, the labor for detaching the second connector 500 and the first connector 200 is saved by the handle 710.

In this embodiment, the server of this invention may be applied to Artificial Intelligence (AI) computing, edge computing, or may be used as a 5G server, a cloud server or a Vehicle-to-everything (V2X) server.

According to the server disclosed by above embodiments, the handle is movably disposed on the motherboard, and the mounting protrusion is disposed on the expansion card. That is, comparing to the conventional server where the handle is disposed on the expansion card and the mounting protrusion is disposed on the motherboard, the present invention exchanges the disposed positions of the handle and the mounting protrusion. Accordingly, by moving the handle from the expansion card to the motherboard, the labor-saving efficacy is kept while preventing the handle from occupying significant amount of space on the expansion card. In this way, not only the overall weight of the expansion card is reduced, but also the space on the expansion card available for other components is increased.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A server, comprising:
   a motherboard;
   a first connector, disposed on the motherboard;
   an expansion card;
   a second connector, disposed on the expansion card and plugged with the first connector; and
   an auxiliary assembly, comprising a handle and a mounting protrusion, wherein the handle is movably disposed on the motherboard, and the mounting protrusion is disposed on the expansion card;
   a first bracket, wherein the first bracket is fixed to the motherboard, and the handle is pivotally connected to the first bracket; and
   wherein, when the handle pushes the mounting protrusion, the handle facilitates the second connector and the first connector to be plugged with or detach from each other, so as to facilitate the motherboard to be electrically connected to or electrically disconnected from the expansion card;
   wherein the handle comprises a pivoted part, a connecting part, a pushing protrusion and a handheld part, the pivoted part is pivotally connected to the first bracket, the connecting part and the pushing protrusion are connected to two opposite sides of the pivoted part, respectively, the connecting part connects the pivoted part and the handheld part, and when the pushing protrusion pushes the mounting protrusion, the handle facilitates the second connector and the first connector to be detached from each other.

2. The server according to claim 1, wherein the connecting part of the handle comprises a notch, and when the mounting protrusion is located in the notch and is pushed by a wall surface of the connecting part forming the notch, the handle facilitates the second connector and the first connector to be plugged with each other.

3. The server according to claim 2, wherein a radial protruding length of the handheld part relative to the pivoted part is longer than a radial protruding length of the pushing protrusion relative to the pivoted part and a radial protruding length of the notch relative to the pivoted part.

4. The server according to claim 1, wherein the first bracket comprises a first fixed plate and a first side plate, the first fixed plate is fixed to a side of the motherboard located closest to the expansion card, the first side plate stands on a side of the first fixed plate located farthest away from the motherboard, and the handle is pivotally connected to the first side plate.

5. The server according to claim 4, wherein the first fixed plate comprises a first through hole, and the first connector is disposed through the first through hole.

6. The server according to claim 1, further comprising a second bracket, wherein the second bracket is fixed to the expansion card, and the mounting protrusion protrudes from the second bracket.

7. The server according to claim 6, wherein the second bracket comprises a second fixed plate and a second side plate, the second fixed plate is fixed to a side of the expansion card located closest to the motherboard, the second side plate stands on a side of the second fixed plate located farthest away from the expansion card, and the mounting protrusion protrudes from the second side plate.

8. The server according to claim 7, wherein the second fixed plate comprise a second through hole, and the second connector is disposed through the second through hole.

\* \* \* \* \*